United States Patent
Lee et al.

(10) Patent No.: US 7,839,647 B2
(45) Date of Patent: Nov. 23, 2010

(54) INSULATING FILM, PRINTED CIRCUIT BOARD SUBSTRATE AND PRINTED CIRCUIT BOARD INCLUDING SAME

(75) Inventors: Wen-Chin Lee, Taoyuan (TW); Cheng-Hsien Lin, Taoyuan (TW)

(73) Assignee: Foxconn Advanced Technology, Inc., Tayuan, Taoyuan (TW)

( * ) Notice: Subject to any disclaimer, the term of this patent is extended or adjusted under 35 U.S.C. 154(b) by 0 days.

(21) Appl. No.: 12/346,804

(22) Filed: Dec. 30, 2008

(65) Prior Publication Data
US 2009/0277680 A1 Nov. 12, 2009

(30) Foreign Application Priority Data
May 6, 2008 (CN) .................. 2008 1 0301424

(51) Int. Cl.
*H05K 1/00* (2006.01)
(52) U.S. Cl. .................. 361/751; 442/1; 977/734; 977/700; 977/701; 977/712; 428/112; 174/360; 174/393
(58) Field of Classification Search ............. 442/1; 977/734, 700, 701, 712; 428/112; 174/360, 174/393; 361/751
See application file for complete search history.

(56) References Cited

U.S. PATENT DOCUMENTS

| 4,706,167 | A | * | 11/1987 | Sullivan ................. 361/774 |
| 5,557,064 | A | * | 9/1996 | Isern-Flecha et al. ....... 174/393 |
| 7,199,970 | B2 | * | 4/2007 | Boss et al. .............. 360/97.02 |
| 7,224,571 | B2 | * | 5/2007 | Srinivasan et al. ....... 361/306.3 |
| 2004/0138733 | A1 | * | 7/2004 | Weber et al. ............. 623/1.11 |
| 2005/0116336 | A1 | * | 6/2005 | Chopra et al. ............ 257/720 |
| 2006/0048963 | A1 | * | 3/2006 | Nishinaka et al. ........ 174/52.2 |
| 2006/0111008 | A1 | * | 5/2006 | Arthur et al. .............. 445/46 |
| 2009/0227162 | A1 | * | 9/2009 | Kruckenberg et al. ......... 442/1 |

FOREIGN PATENT DOCUMENTS

WO 03/013199 A2 2/2003

* cited by examiner

*Primary Examiner*—Hung S Bui
*Assistant Examiner*—Steven Sawyer
(74) *Attorney, Agent, or Firm*—Clifford O. Chi

(57) ABSTRACT

An insulating film includes a first polymer layer, a second polymer layer and an electromagnetic shielding layer sandwiched between the first polymer layer and the second polymer layer. The electromagnetic shielding layer includes a number of carbon nanotube films that are substantially parallel to the first and second polymer layer. Each of the carbon nanotube films includes a number of carbon nanotubes that are substantially parallel to each other. The insulating film can provide anti-EMI effect in printed circuit boards without employing additional electromagnetic shielding layers.

18 Claims, 10 Drawing Sheets

INSULATING FILM, PRINTED CIRCUIT BOARD SUBSTRATE AND PRINTED CIRCUIT BOARD INCLUDING SAME

BACKGROUND

1. Technical Field

The present invention relates to printed circuit boards, and particularly to insulating films for printed circuit boards, printed circuit board substrate made form the insulating films and printed circuit boards made from the printed circuit board substrates.

2. Discussion of Related Art

Recently, to meet increasingly strict requirement of electronic devices, printed circuit boards are becoming greater in number of layers and higher in circuit distribution density. Accordingly, electromagnetic interference (EMI) between different parts of printed circuit boards is correspondingly increased, which greatly decreases performance of printed circuit boards.

Currently, to reduce EMI in printed circuit boards, additional electromagnetic shielding layers (i.e. a copper layer without circuit formed therein) may be employed in printed circuit boards. However, these additional electromagnetic shielding layers increase thickness and decrease a circuit density of printed circuit boards. Therefore, what is needed is a new printed circuit board capable of providing electromagnetic shielding ability without employing additional electromagnetic shielding layers.

SUMMARY

In one exemplary embodiment, an insulating film includes a first polymer layer, a second polymer layer and an electromagnetic shielding layer sandwiched between the first polymer layer and the second polymer layer. The electromagnetic shielding layer includes a number of carbon nanotube films that are substantially parallel to the first and second polymer layer. Each of the carbon nanotube films includes a number of carbon nanotubes that are substantially parallel to each other.

This and other features and advantages of the present invention as well as the preferred embodiments thereof and an insulating film for printed circuit boards in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE EMBODIMENTS

Figure 1:
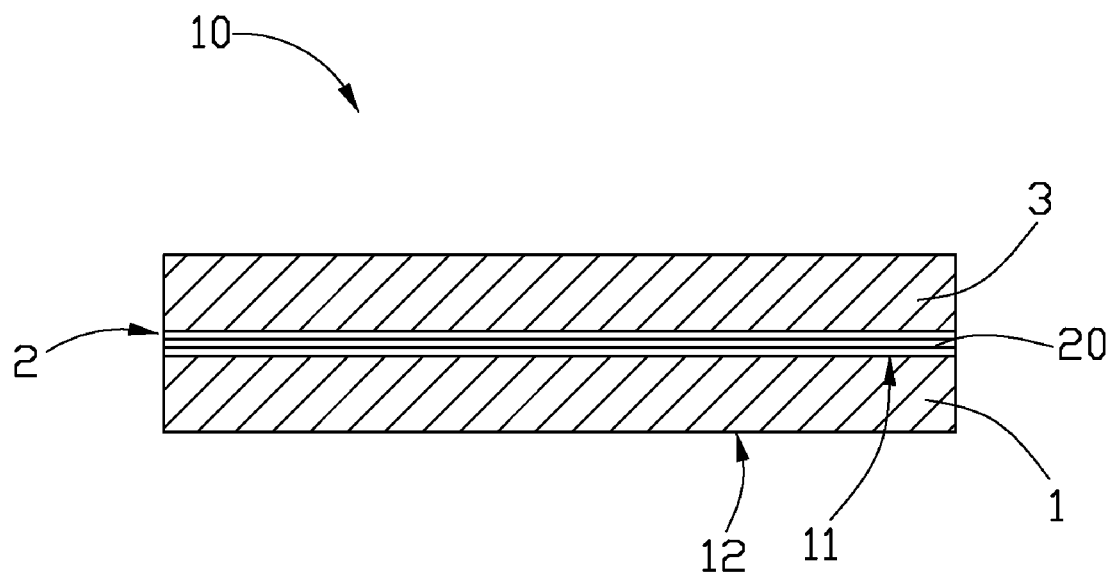
FIG. 1 is a schematic view of an insulating film in accordance with a first embodiment.

Referring to FIG. 1, a first embodiment of an insulating film 10 includes a first polymer layer 1, a second polymer layer 3 and an electromagnetic shielding layer 2 sandwiched between the first polymer layer 1 and the second polymer layer 3. In the present embodiment, the first polymer layer 1 and the second polymer layer 3 are B-Stage polymer. In the printed circuit board field, the B-Stage polymer is a semi-solidified polymer.

The first polymer layer 1 includes a first surface 11 and a second surface 12 on an opposite side of the first surface 11. The first surface 11 and the second surface 12 are plane surfaces. The first polymer layer 1 and the second polymer layer 3 can be made of a flexible material selected from a group consisting of polyimide, polytetrafluoroethylene, polythiamine, polymethacrylic acid, polycarbonate, polycarbonate ester, polyester, copolymer of imide, ethylene and dimethyl terephthate. However, the first polymer layer 1 and the second polymer layer 3 can also be made from a relative rigid material such as epoxy polymer.

The electromagnetic shielding layer 2 is formed on the first surface 11 of the first polymer layer 1. The electromagnetic shielding layer 2 separates the first polymer layer 1 and the second polymer layer 3. A thickness of the electromagnetic shielding layer 2 is in a range from about 5 micrometers to about 50 micrometers. In the first embodiment, the electromagnetic shielding layer 2 has a same shape with the first polymer layer 1 and the second polymer layer 3. The electromagnetic shielding layer 2 includes a number of sequentially laminated carbon nanotube films 20. The electromagnetic shielding layer 2 is parallel to the first polymer layer 1 and the second polymer layer 3. In other words, the carbon nanotube films 20 are parallel to the first polymer layer 1 and the second polymer layer 3. Each of the carbon nanotube films 20 includes a number of carbon nanotubes that are substantially parallel to each other. In detail, each carbon nanotube film 20 can be seen to include a number of carbon nanotubes connected end to end.

Figure 4:
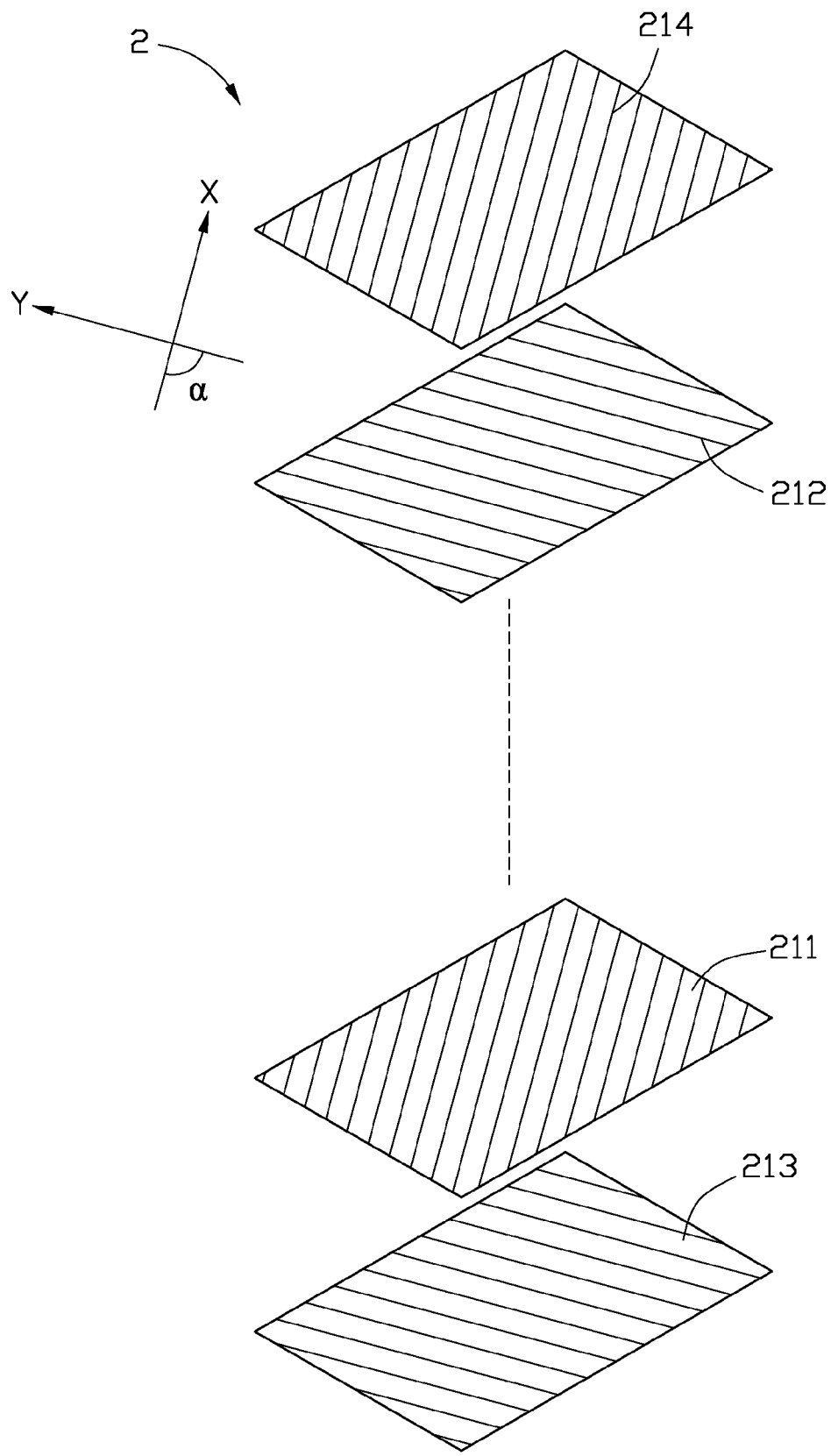
FIG. 4 is a schematic view showing a process of stacking the carbon nanotube films.

The carbon nanotubes in each of the carbon nanotube films 20 may extend in a same direction. Alternatively, the carbon nanotubes in one carbon nanotube film 20 may extend in a direction at an angle with the carbon nanotubes in a neighboring carbon nanotube film 20. For example, as shown in FIG. 4, the carbon nanotubes 211 are at an angle $\alpha$ with carbon nanotubes 212, 213 of two neighboring carbon nanotube films 20, the carbon nanotubes 212 are also at an angle $\alpha$ with carbon nanotubes 211, 214 of two neighboring carbon nanotube films.

In the first embodiment, the electromagnetic shielding layer 2 includes m layers of sequentially laminated carbon nanotube film, wherein m represents a natural number greater than 2. The m layers of carbon nanotubes film are numbered first, second . . . nth . . . mth. The carbon nanotubes in the nth layer of the m layers of carbon nanotubes film are at an angle $(n-1)*\theta$ with the carbon nanotubes in the first carbon nanotubes film, wherein n represents a natural number between 2 to m, θ represents an angle between 0 to 90 degrees. In another embodiment, the angle θ is in a range from about 0 degrees to about 60 degrees. As such, the m layers of carbon nanotubes film constitute a net-like structure.

In the present insulating film 10, the electromagnetic shielding layer 2 can greatly reduce an electromagnetic interference between electronic components or electrical wires located at two opposite sides of the insulating film 10. In addition, the carbon nanotube films 20 have high strength and heat conductivity along its axis direction. Thus the insulating film 10 is capable of carrying more electronic components and efficiently dissipating heat in the insulating film 10 to the outer atmosphere.

Figure 2:
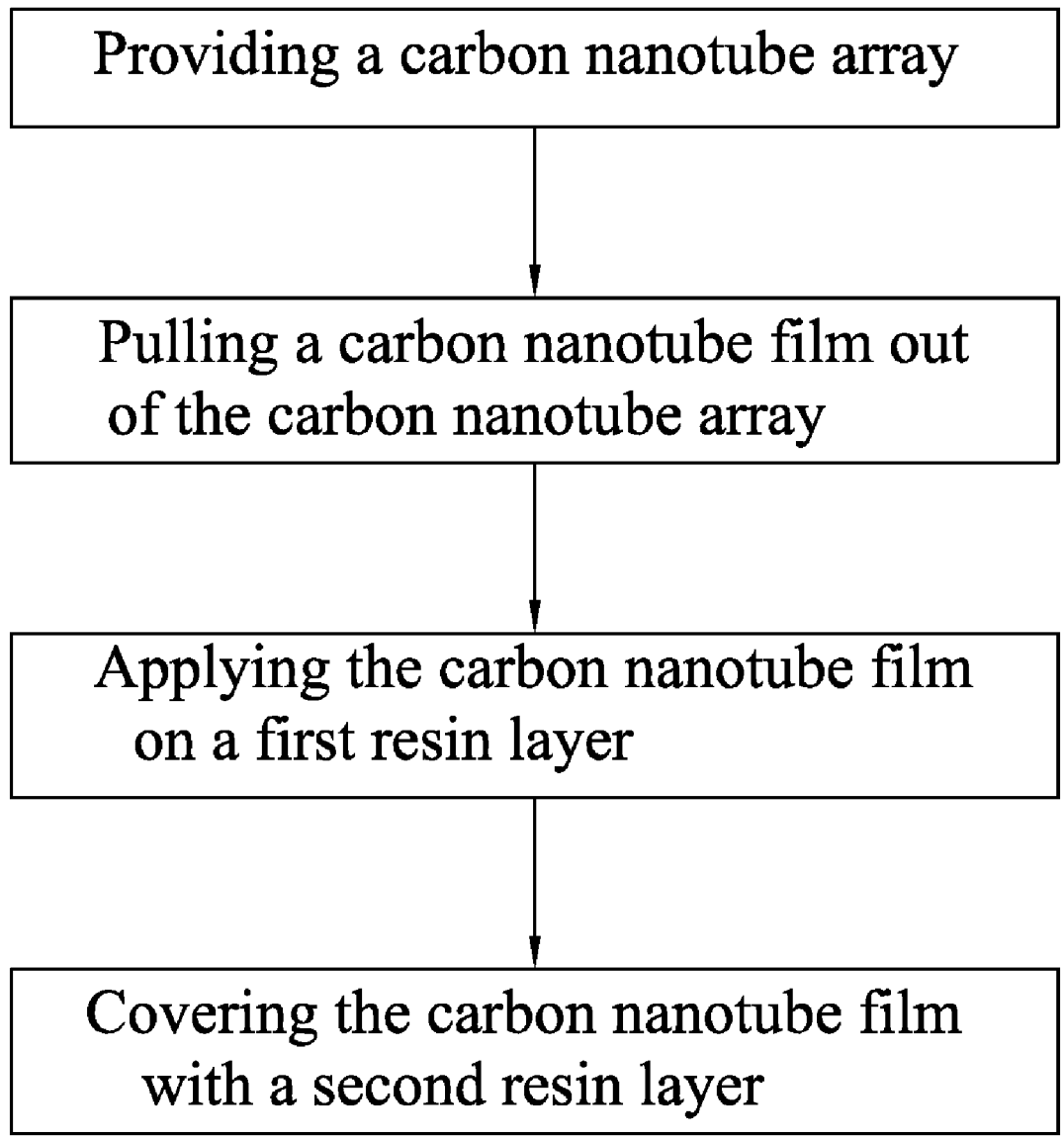
FIG. 2 is a flow chart of a method for manufacturing the insulating film of FIG. 1.

Referring to FIG. 2, a method for manufacturing the insulating film 10 is described in detail as follows.

In step 1, a carbon nanotubes array 200 is provided. The carbon nanotubes array 200 can be grown using a chemical vapor deposition (CVD) method. Science, 1999, 283, 512-414, J. Am. Chem. Soc, 2001, 123, 11502-11503 and Chinese published patent application numbered 02134760.3 disclose method of manufacturing super aligned carbon nanotubes array, which are incorporated herein by reference. Generally, in these methods, firstly, a plain substrate is provided and a catalyst layer is deposited on the plain substrate. The catalyst layer will be annealed in an inert gas at a temperature between 300 degrees Celsius to 400 degrees Celsius for about 10 hours and then the catalyst layer will be heated to a temperature between 500 degrees Celsius and 700 degrees Celsius. The carbon nanotubes will grow on the heated substrate when a carbon source gas (i.e. ethyne or ethene) is introduced to a surface of the heated substrate. Appropriate reaction time for growing carbon nanotubes is in a range from about 5 minutes to about 10 minutes.

Figure 3:
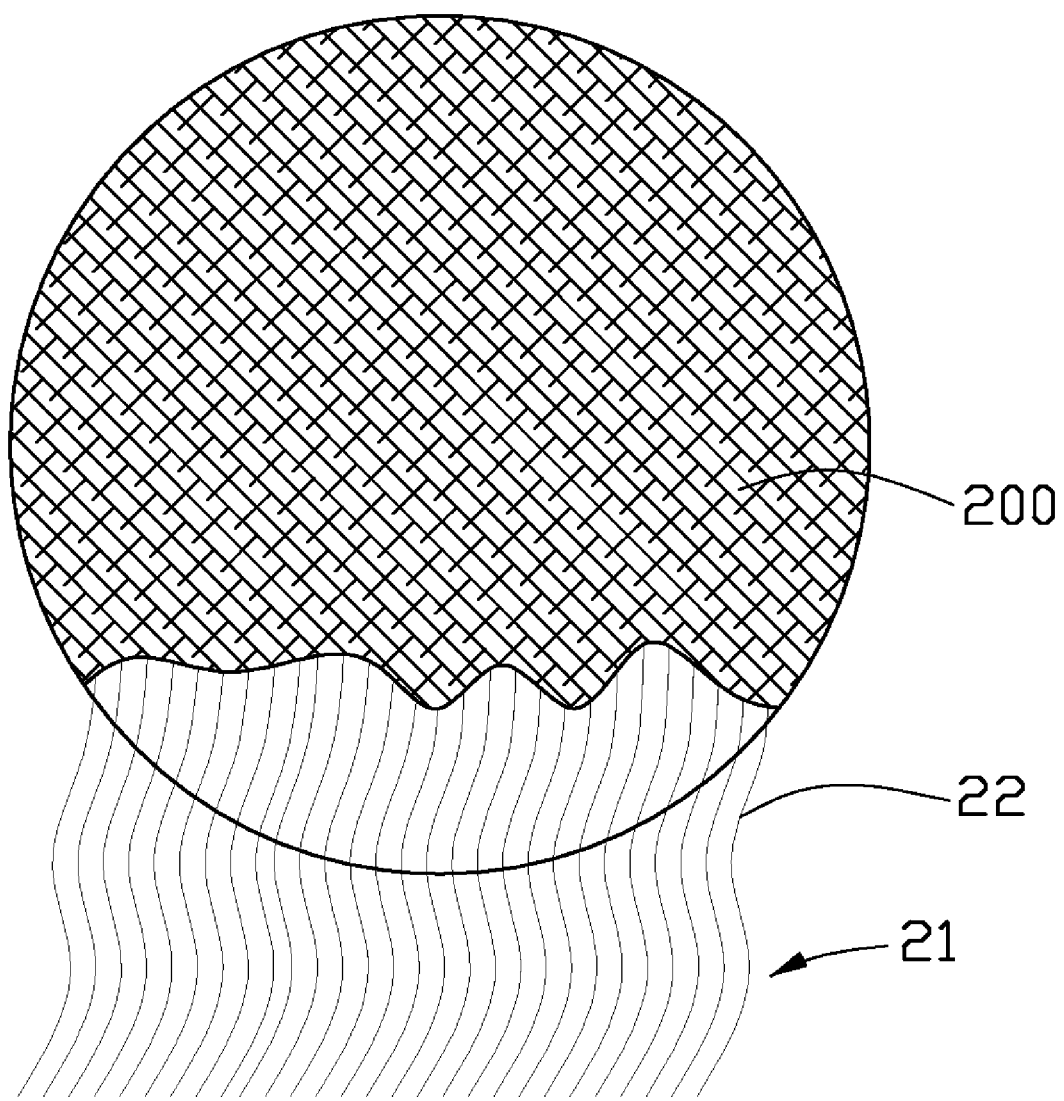
FIG. 3 is a schematic view showing a process for forming carbon nanotube films.

In step 2, as shown in FIG. 3, a number of carbon nanotube bundles 22 are pulled out of the carbon nanotube array 200 along a direction away form the carbon nanotubes array 200 using a tool such as a tweezer. Each carbon nanotube bundle 22 pulls a new carbon nanotube bundle 22 connected to the prior carbon nanotube bundle 22 end to end from the carbon nanotube array 200 when a bottom end of the prior carbon nanotube bundle 22 reaches a top surface of the carbon nanotube array 200. The new carbon nanotube bundle 22 pulls another new carbon nanotube bundle 22 connected to the new carbon nanotube bundle 22 end to end from the carbon nanotube array 200. The abreast arranged carbon nanotube bundles 22 constitute a continuous carbon nanotube film 20.

In step 3, the first surface 11 of the first polymer layer 1 is covered using the carbon nanotube films 20 so as to form the electromagnetic shielding layer 2 on the first surface 11. Generally, the electromagnetic shielding layer 2 includes 10 or more layers of carbon nanotube films 20, and a thickness of the electromagnetic shielding layer 2 is in a range from about 1 micrometer to about 50 micrometers. The carbon nanotubes in different carbon nanotube films 20 may extend in a same or different direction. In the present embodiment, the electromagnetic shielding layer 2 includes m layers of sequentially laminated the carbon nanotube films 20, wherein m represents a natural number greater than two. The carbon nanotubes in the nth layer of the m layers of carbon nanotube film 20 are at an angle (n−1)*θ with that in the first carbon nanotube film in the m layers of carbon nanotube film 20, wherein n represents a natural number between 2 to m, and θ represents an angle between 0 to 90 degrees. In another embodiment, the angle θ is in a range from about 0 degrees to about 60 degrees.

In step 4, the second polymer layer 3 is placed on the electromagnetic shielding layer 2 and laminated together with the electromagnetic shielding layer 2 and the first polymer layer 1. Finally, the insulating film 10 is obtained.

Figure 5:
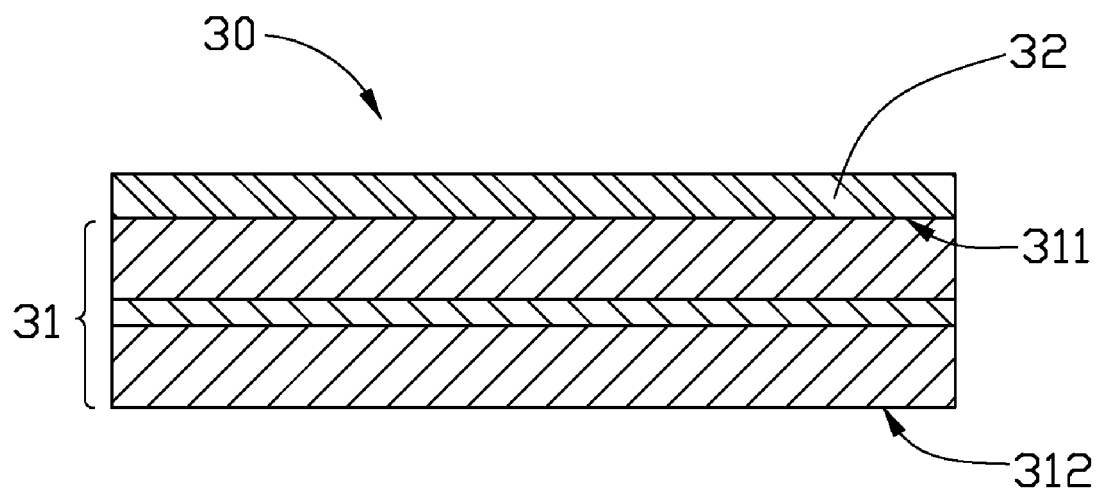
FIG. 5 is a cross sectional view showing a printed circuit board substrate made from the insulating film of FIG. 1.

FIG. 5 illustrates a single-sided printed circuit board substrate 30. The printed circuit board substrate 30 includes an insulating layer 31 and at least one metallic layer 32 formed on the insulating layer 31. The insulating layer 30 has a same structure with the insulating layer 10. The insulating layer 31 includes a first surface 311 and an opposite second surface 312. The metallic layer 32 is made of copper coil.

Figure 6:
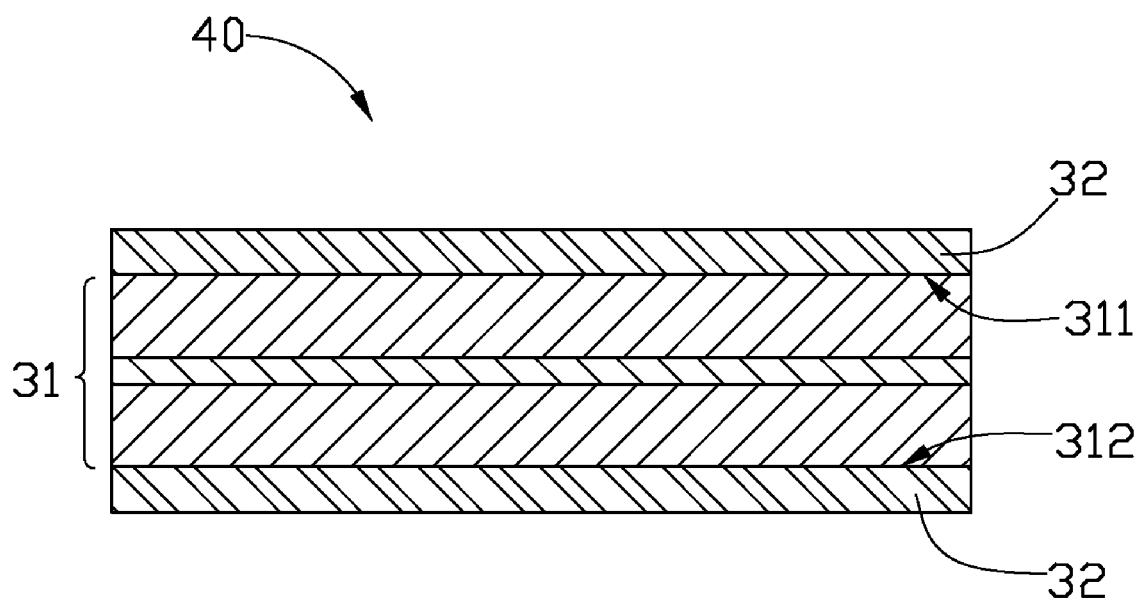
FIG. 6 is a cross sectional view showing another printed circuit board substrate made from the insulating film of FIG. 1.

In another embodiment, as shown in FIG. 6, a double-sided printed circuit board substrate 40 is provided. The printed circuit board substrate 40 includes an insulating layer 31. The insulating layer 31 includes a first surface 311 and an opposite surface 312. Two copper layers 32 are formed on the first, second surface 311, 312 respectively.

Figure 7:
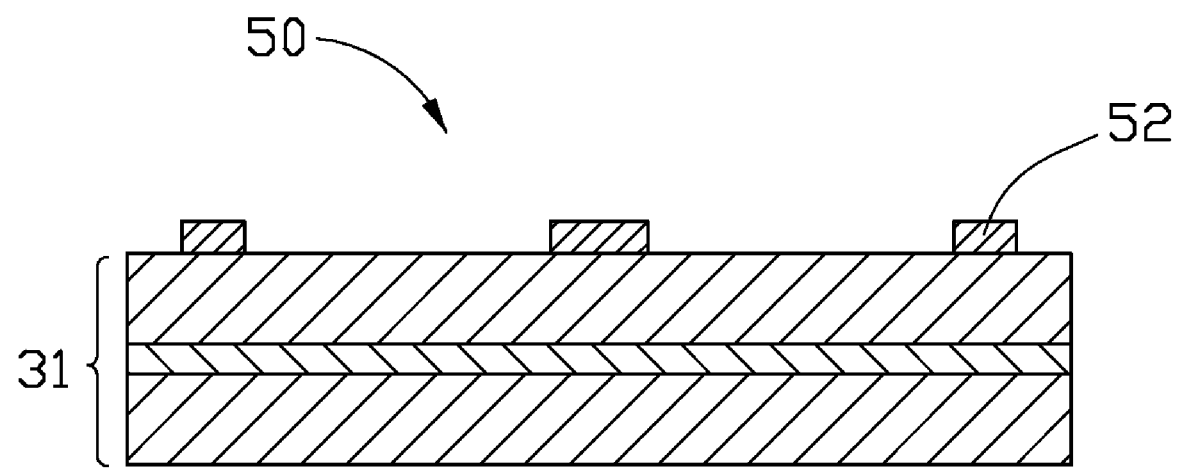
FIG. 7 is a cross sectional schematic view showing a printed circuit board made from the printed circuit board substrate of FIG. 5.
Figure 8:
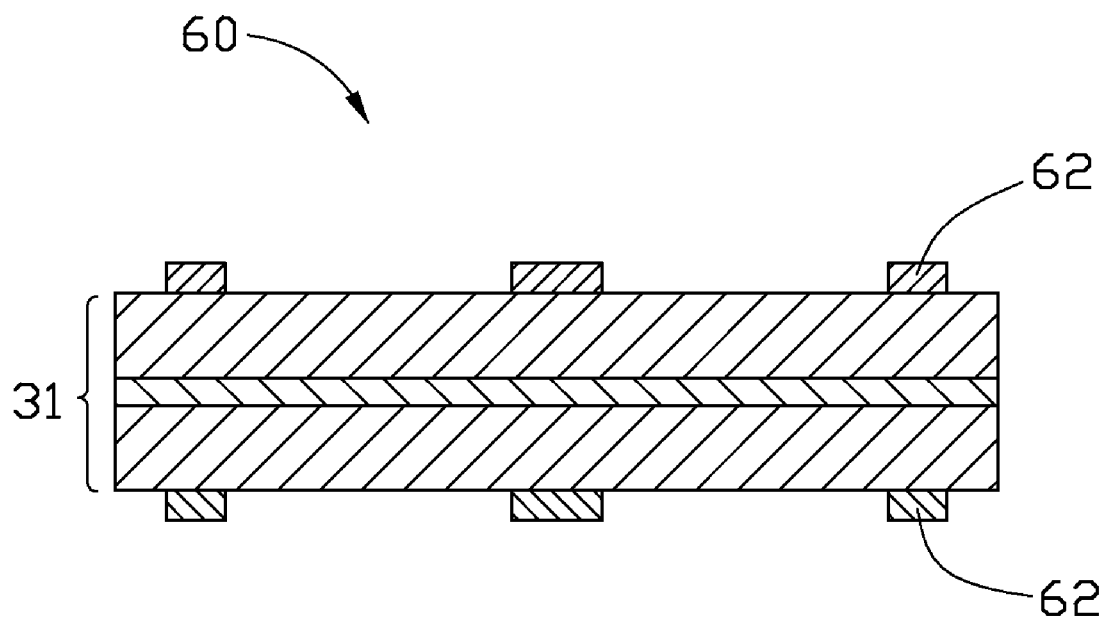
FIG. 8 is a cross sectional schematic view showing a printed circuit board made from the printed circuit board substrate of FIG. 6.

FIG. 7 illustrates a single-sided printed circuit board 50 made from the printed circuit board substrate 30. The metallic layer 32 of the printed circuit board substrate 30 is made into a number of electrically conductive traces 52. Referring to FIG. 8, a double-sided printed circuit board 60 can be made from the printed circuit board substrate 40. The two copper layers 32 of the printed circuit substrate 40 are made into a number of electrically conductive traces 52 respectively.

Figure 9:
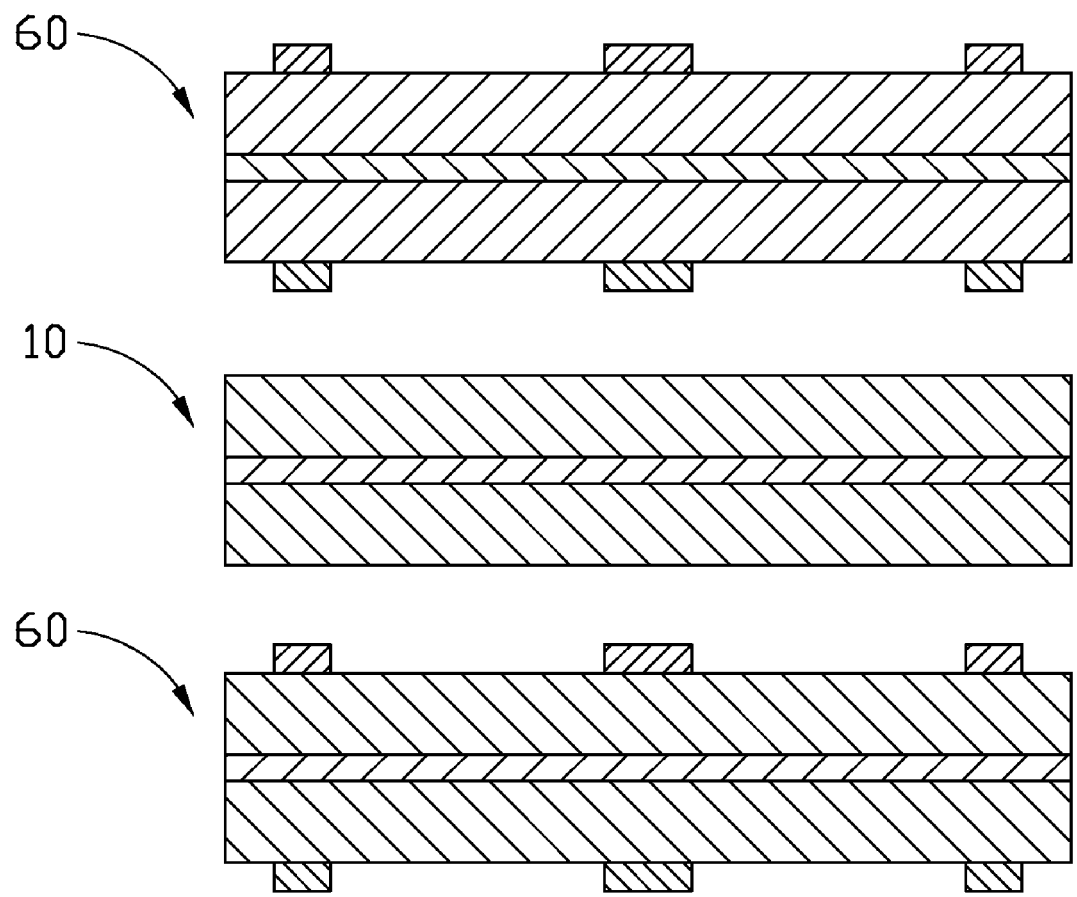
FIGS. 9 and 10 are schematic views showing a laminating process for manufacturing a multilayer printed circuit board.
Figure 10:
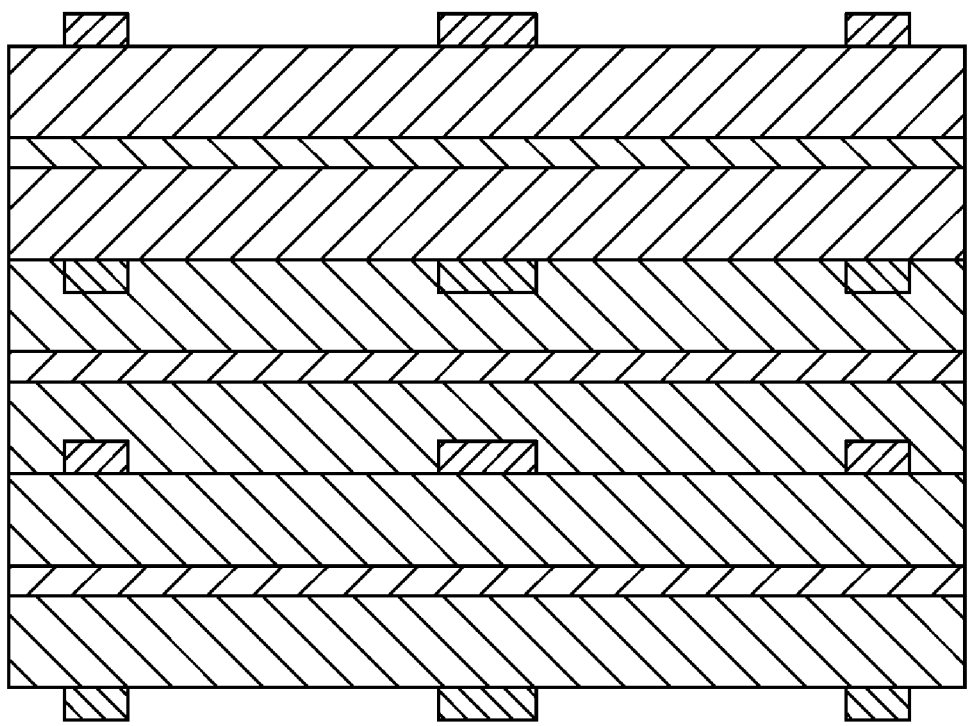

It is to be understood that the insulating film 10, the printed circuit board substrate 30, and the printed circuit board substrate 40 can also be used to manufacture multilayer printed circuit boards. Referring to FIGS. 9 and 10, two double-sided printed circuit boards 60 and one insulating layer 10 are provided and laminated together thereby obtaining a multilayer printed circuit board 70.

In the printed circuit boards 60 and 70, one electromagnetic shielding layer 2 is between each two adjacent metallic layer, thus electromagnetic interference between the two adjacent metallic layers is greatly reduced. In addition, the carbon nanotube films 21 have high strength and heat conductivity along its axis direction. Thus the printed circuit boards 60 and 70 are capable of carrying more electronic components and efficiently dissipating heat generated in the printed circuit boards 60 and 70 to the outer atmosphere.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An insulating film, comprising:
   a first polymer layer;
   a second polymer layer; and
   an electromagnetic shielding layer sandwiched between the first polymer layer and the second polymer layer; the electromagnetic shielding layer comprising a plurality of carbon nanotube films stacked one on another, the carbon nanotube films being substantially parallel to the first and second polymer layers, each of the carbon nanotube films comprising a plurality of carbon nanotubes which are connected end to end and substantially parallel to each other;
   wherein the electromagnetic shielding layer includes m layers of the carbon nanotube films, m represents a natural number greater than two, the carbon nanotubes in the nth layer of the m layers of the carbon nanotube films are oriented an angle of (n−1)*θ relative to the carbon nanotubes in the first layer of the carbon nanotube films which is proximate to the second polymer layer, n represents a natural number between 2 to m, θ represents an angle between 0 to 90 degrees.

2. A printed circuit board substrate, comprising:

an insulating film comprising a first polymer layer, a second polymer layer and an electromagnetic shielding layer sandwiched between the first polymer layer and the second polymer layer, the electromagnetic shielding layer comprising a plurality of carbon nanotube films stacked one on another, the carbon nanotube films being substantially parallel to the first and second polymer layer, each of the carbon nanotube films comprising a plurality of carbon nanotubes which are connected end to end and substantially parallel to each other; and a metallic layer formed on the insulating film;

wherein the electromagnetic shielding layer comprising m layers of the carbon nanotube films, m represents a natural number greater than two, the carbon nanotubes in the nth layer of the m layers of the carbon nanotube films are at an angle (n−1)*θ with the carbon nanotubes in the first carbon nanotube film in the m layers of the carbon nanotube films, n represents a natural number between 2 to m, θ represents an angle between 0 to 90 degrees.

3. A printed circuit board, comprising:

an insulating film comprising a first polymer layer, a second polymer layer and an electromagnetic shielding layer sandwiched between the first polymer layer and the second polymer layer, the electromagnetic shielding layer comprising a plurality of carbon nanotube films stacked one on another, the carbon nanotube films being substantially parallel to the first and second polymer layer, each of the carbon nanotube films comprising a plurality of carbon nanotubes which are connected end to end and substantially parallel to each other; and a metallic layer formed on the insulating film, the metallic layer including a plurality of electrically conductive traces;

wherein the electromagnetic shielding layer comprising m layers of the carbon nanotube films, m represents a natural number greater than two, the carbon nanotubes in the nth layer of the m layers of the carbon nanotube films are at an angle (n−1)*θ with the carbon nanotubes in the first carbon nanotube film in the m layers of the carbon nanotube films, n represents a natural number between 2 to m, θ represents an angle between 0 to 90 degrees.

4. The insulating film of claim 1, wherein the first polymer is made of a flexible material selected from the group consisting of polyimide, polytetrafluoroethylene, and polycarbonate.

5. The insulating film of claim 4, wherein the second polymer is made of a flexible material selected from the group consisting of polyimide, polytetrafluoroethylene, and polycarbonate.

6. The insulating film of claim 1, wherein the first polymer is made of epoxy polymer.

7. The insulating film of claim 6, wherein the second polymer is made of epoxy polymer.

8. The insulating film of claim 1, wherein the angle θ is in a range from about 0 degrees to about 60 degrees.

9. The printed circuit board substrate of claim 2, wherein the first polymer is made of a flexible material selected from the group consisting of polyimide, polytetrafluoroethylene, and polycarbonate.

10. The printed circuit board substrate of claim 9, wherein the second polymer is made of a flexible material selected from the group consisting of polyimide, polytetrafluoroethylene, and polycarbonate.

11. The printed circuit board substrate of claim 2, wherein the first polymer is made of epoxy polymer.

12. The printed circuit board substrate of claim 11, wherein the second polymer is made of epoxy polymer.

13. The printed circuit board substrate of claim 2, wherein the angle θ is in a range from about 0 degrees to about 60 degrees.

14. The printed circuit board of claim 3, wherein the first polymer is made of a flexible material selected from the group consisting of polyimide, polytetrafluoroethylene, and polycarbonate.

15. The printed circuit board of claim 14, wherein the second polymer is made of a flexible material selected from the group consisting of polyimide, polytetrafluoroethylene, and polycarbonate.

16. The printed circuit board of claim 3, wherein the first polymer is made of epoxy polymer.

17. The printed circuit board of claim 16, wherein the second polymer is made of epoxy polymer.

18. The printed circuit board of claim 3, wherein the angle θ is in a range from about 0 degrees to about 60 degrees.

\* \* \* \* \*